(12) United States Patent
Ashley et al.

(10) Patent No.: US 7,865,814 B2
(45) Date of Patent: *Jan. 4, 2011

(54) PATH METRIC DIFFERENCE COMPUTATION UNIT FOR COMPUTING PATH DIFFERENCES THROUGH A MULTIPLE-STEP TRELLIS

(75) Inventors: Jonathan James Ashley, Los Gatos, CA (US); Kelly Knudson Fitzpatrick, Sudbury, MA (US); Erich Franz Haratsch, Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/547,921

(22) Filed: Aug. 26, 2009

(65) Prior Publication Data

US 2009/0319875 A1  Dec. 24, 2009

Related U.S. Application Data

(63) Continuation of application No. 11/045,585, filed on Jan. 28, 2005, now Pat. No. 7,607,072.

(51) Int. Cl.
   *H03M 13/03* (2006.01)
(52) U.S. Cl. ......................... 714/792; 714/795; 714/806
(58) Field of Classification Search ................. 714/792, 714/795, 786, 800, 806, 819; 369/59.22
See application file for complete search history.

(56) References Cited

U.S. PATENT DOCUMENTS 6,094,465 A * 7/2000 Stein et al. .................. 375/346
6,396,878 B1 * 5/2002 Piirainen .................... 375/262
6,581,182 B1 * 6/2003 Lee .............................. 714/795
6,940,800 B2 * 9/2005 Fujimoto et al. .......... 369/59.22

(Continued)

OTHER PUBLICATIONS

Black et al., "A 140-Mb/x, 32-State, Radix-4 Vieterbi Decoder," IEEE Journal of Solid-State Circuits, vol. 27, No. 12, pp. 1877-1885 (Dec. 1992).

(Continued)

*Primary Examiner*—Fritz Alphonse
(74) *Attorney, Agent, or Firm*—Ryan, Mason & Lewis, LLP

(57) ABSTRACT

A path metric difference computation unit is disclosed for computing path differences through a multiple-step trellis. Path differences are computed between paths through a multiple-step trellis, wherein a first path is a winning path for each single-step-trellis period of a multiple-step-trellis cycle, a second path is a winning path for a first single-step-trellis period and is a losing path for a second single-step-trellis period and a third path is a losing path for a first single-step-trellis period and is a winning path for a second single-step-trellis period. The disclosed path metric difference computation unit comprises path metric difference generators for generating a path metric difference $\Delta_0$ for a second single-step-trellis period based on a difference between the first path and the second path, and a path metric difference $\Delta_{-1}$ for a first single-step-trellis period based on a difference between the first path and the third path, wherein intermediate path metric values or intermediate path metric difference values are reused to generate the path metric differences $\Delta_0$ or $\Delta_{-1}$.

20 Claims, 11 Drawing Sheets

U.S. PATENT DOCUMENTS

| | | | | |
|---|---|---|---|---|
| 7,020,214 | B2* | 3/2006 | Bickerstaff | 375/265 |
| 7,032,163 | B2* | 4/2006 | Yano et al. | 714/786 |
| 7,085,992 | B2* | 8/2006 | Becker et al. | 714/795 |
| 7,136,413 | B2* | 11/2006 | Hwang et al. | 375/229 |
| 7,200,094 | B2* | 4/2007 | Fujimoto et al. | 369/59.22 |
| 7,222,288 | B2* | 5/2007 | Varma et al. | 714/795 |

OTHER PUBLICATIONS

Fettweis et al., "High-Speed Parallel Viterbi Decoding: Algorithm and VLSI-Architecture," IEEE Communications Magazine, pp. 46-54 (May 1991).

Joeressen et al., "A 40 Mb/s Soft-Output Viterbi Decoder," IEEE Journal of Solid-State Circuits, vol. 30, No. 7, pp. 812-818 (Jul. 7, 1995).

Joeressen et al., "High-Speed VLSI Architecture for Soft-Output Viterbi Decoding," Conference on Application Specific Array Processors, pp. 373-384 (Aug. 4-7, 1992).

Yeo et al., "A 500-Mb/s Soft-Output Viterbi Decoder," IEEE Journal of Solid-State Circuits, vol. 38, No. 7, pp. 1234-1241 (Jul. 7, 2003).

Bickerstaff et al., "A 24Mb/s Radlx-4 LogMAP Turbo Decoder for 3GPP-HSDPA Mobile Wireless," IEEE International Solid-State Circuits Conference (ISSCC), Digest of Technical Papers, vol. 1, pp. 150-484 (2003).

Black et al., "A 140-Mb/s, 32-State, Radix-4 Viterbi Decoder," IEEE Journal of Solid-State Circuits, vol. 27, Issue 12, pp. 1877-1885 (Dec. 1992).

Cypher et al., "Generalized Trace Back Techniques for Survivor Memory Management in the Viterbi Algorithm," Global Telecommunications Conference and Exhibition, Communications: Connecting the Future, vol. 2, pp. 1318-1322 (Dec. 2-5, 1990).

Fettweis et al, "High-Speed Parallel Viterbi Decoding: Algorithm and VLSI-Architecture," IEEE Communications Magazine, vol. 29, Issue 5, pp. 46-55 (May 1991).

Hagenauer et al., "A Viterbi Algorithm with Soft-Decision Outputs and its Applications," IEEE Global Telecommunications Conference (Globecom), vol. 3, pp. 1680-1686 (Nov. 1989).

Joeressen et al., "A 40 Mb/s Soft-Output Viterbi Decoder," IEEE Journal of Solid-State Circuits, vol. 30, Issue 7, pp. 812-818 (Jul. 1995).

Joeressen et al., "High-Speed VLSI Architectures for Soft-Output Viterbi Decoding," Proceedings of the International Conference on Application Specific Array Processors, pp. 373-384 (Aug. 4-7, 1992).

Yeo et al., "A 500-Mb/s Soft-Output Viterbi Decoder," IEEE Journal of Solid-State Circuits, vol. 38, No. 7, pp. 1234-1241 (Jul. 2003).

Li et al., "Multi-Order Soft Output Viterbi Algorithm (SOVA) Decoder Fix Point Performance Simulation," Proc. of Info-Tech and Info-Net, vol. 2, pp. 151-155 (Oct. 29 2001).

Luthi et al., "High Rate Soft Output Viterbi Decoder," Proc. European Design and Test Conference, pp. 315-319 (Mar. 11, 1996).

Joeressen et al., "High-Speed VLSI Architectures for Soft-Output Viterbi Decoding," Journal of VLSI Signal Processing Systems for Signal, Image, and Video Technology, vol. 8, No. 2, pp. 169-181 (Oct. 1, 1994).

Yeo et al., "A 500-Mb/s Soft-Output Viterbi Decoder," IEEE Journal of Solid-State Circuits, vol. 38, No. 7, pp. 1234-1241 (Jul. 2003).

* cited by examiner

PATH METRIC DIFFERENCE COMPUTATION UNIT FOR COMPUTING PATH DIFFERENCES THROUGH A MULTIPLE-STEP TRELLIS

CROSS-REFERENCE TO RELATED APPLICATIONS

The present application is a continuation of U.S. patent application Ser. No. 11/045,585, filed Jan. 28, 2005, now U.S. Pat. No. 7,607,072; and is related to U.S. patent application Ser. No. 10/853,087, now U.S. Pat. No. 7,487,432, entitled "Method and Apparatus for Multiple Step Viterbi Detection with Local Feedback," filed on May 25, 2004; each incorporated by reference herein.

FIELD OF THE INVENTION

The present invention relates generally to equalization, detection and decoding techniques using the Soft-Output Viterbi Algorithm (SOVA).

BACKGROUND OF THE INVENTION

A magnetic recording read channel converts an analog read channel into an estimate of the user data recorded on a magnetic medium. Read heads and magnetic media introduce noise and other distortions into the read signal. As the information densities in magnetic recording increase, the intersymbol interference (ISI) becomes more severe as well. In read channel chips, a Viterbi detector is typically used to detect the read data bits in the presence of intersymbol interference and noise.

The Soft-Output Viterbi Algorithm (SOVA) is a well known technique for generating soft decisions inside a Viterbi detector. A soft decision provides a detected bit with a corresponding reliability. These soft decisions can be used by an outer detector to improve the error rate performance of the overall system. For a more detailed discussion of SOVA detectors, see, for example, J. Hagenauer and P. Hoeher, "A Viterbi Algorithm with Soft-decision Outputs and its Applications," IEEE Global Telecommunications Conference (GLOBECOM), vol. 3, 1680-1686 (November 1989). SOVA architectures exist for one-step trellises, where one soft decision is generated per clock cycle. SOVA detectors may be implemented, for example, in next-generation read channel systems, and data rates in excess of 2 Gigabits-per-second will have to be achieved. It is challenging to achieve such high data rates with existing SOVA architectures that consider one-step trellises.

A need therefore exists for a method and apparatus for performing SOVA detection at the high data rates that are required, for example, by evolving high-end storage applications. A further need exists for a method and apparatus for performing SOVA detection employing a multiple-step trellis.

SUMMARY OF THE INVENTION

Generally, a path metric difference computation unit is disclosed for computing path differences through a multiple-step trellis. According to one aspect of the invention, the disclosed path metric difference computation unit computes differences between paths through a multiple-step trellis, wherein a first of the plurality of paths is a winning path for each single-step-trellis period of a multiple-step-trellis cycle, a second of the plurality of paths is a winning path for a first single-step-trellis period and is a losing path for a second single-step-trellis period of a multiple-step-trellis cycle and a third of the plurality of paths is a losing path for a first single-step-trellis period and is a winning path for a second single-step-trellis period of a multiple-step-trellis cycle. The disclosed path metric difference computation unit comprises one or more path metric difference generators for generating a path metric difference $\Delta_0$ for a second single-step-trellis period of the multiple-step-trellis cycle based on a difference between the first path and the second path, and a path metric difference $\Delta_{-1}$ for a first single-step-trellis period of the multiple-step-trellis cycle based on a difference between the first path and the third path, wherein one or more of intermediate path metric values and intermediate path metric difference values are reused to generate one or more of the path metric differences $\Delta_0$ and $\Delta_{-1}$. The path metric differences $\Delta_0$ and $\Delta_{-1}$ can be used to compute reliabilities in a reliability unit.

The path metric difference computation unit optionally also includes a comparator to compare path metrics of the second path and a fourth path to identify the second path and a subtractor to determine the path metric difference $\Delta_0$ between the first and second paths. An output of the comparator comprises a selection signal, F, that is used, for example, to compute equivalence bits in a path metric comparison unit.

The path metric difference computation unit optionally also includes (i) a selector to select between the path metrics of the second and fourth paths to identify the second path based on a selection signal; (ii) a subtractor to determine the path metric difference $\Delta_{-1}$ between the first and third paths; (iii) one or more pipeline registers and wherein the first path is determined in a first multiple-step-trellis cycle and the path metric differences are generated in a subsequent multiple-step-trellis cycle; (iv) a comparator for determining a path metric for the first path into a state by comparing path metrics for path extensions into the state; and (v) one or more adders, comparators and selectors to perform an add-compare-select operation for a state to determine the first path.

A more complete understanding of the present invention, as well as further features and advantages of the present invention, will be obtained by reference to the following detailed description and drawings.

DETAILED DESCRIPTION

The present invention recognizes that the limitation on achievable data rates in a SOVA detector is overcome by employing a multiple-step trellis. The multiple-step trellis is obtained from a one-step trellis by collapsing transitions over multiple time steps into one. In other words, each transition in the multiple-step trellis corresponds to multiple transitions in the one-step trellis. For example, in an exemplary two-step trellis, each transition in the two-step trellis corresponds to two transitions in the original one-step trellis. SOVA detectors in accordance with the present invention can operate at data rates that are about twice the data rates of conventional designs that use one-step trellises. Even larger speed-ups are achievable for multiple-step trellises with step sizes larger than two.

One-Step SOVA

The present invention is illustrated in the context of a two-step SOVA, where Viterbi detection is followed by reliability processing. For a discussion of suitable two-step SOVA architectures for one-step trellises, see, for example, O. J. Joeressen and H. Meyr, "A 40-Mb/s Soft-Output Viterbi Decoder," IEEE J. Solid-State Circuits, vol. 30, 812-818 (July, 1995), and E. Yeo et al., "A 500-Mb/s Soft-Output Viterbi Decoder," IEEE Journal of Solid-State Circuits, vol. 38, 1234-1241 (July, 2003). The present invention applies, however, to any SOVA implementation, as would be apparent to a person of ordinary skill in the art. For a discussion of suitable one-step SOVAs, see, for example, J. Hagenauer and P. Hoeher. "A Viterbi algorithm with Soft-Decision Outputs and its Applications." IEEE Global Telecommunications Conference (GLOBECOM), vol. 3, 1680-1686 (November, 1989), and O. J. Joeressen et al., "High-Speed VLSI Architectures for Soft-Output Viterbi Decoding," Journal of VLSI Signal Processing, vol. 8, 169-181 (1994), incorporated by reference herein. It is important to distinguish the terms "one-step SOVA" and "two-step SOVA" from the term "multiple-step trellis." While the term "n-step SOVA" indicates the number of steps, n, required to perform Viterbi and reliability processing, the term "multiple-step trellis" indicates a trellis obtained from a one-step trellis by collapsing transitions over multiple time steps into one.

Two-Step SOVA for a One-Step Trellis

Figure 1:
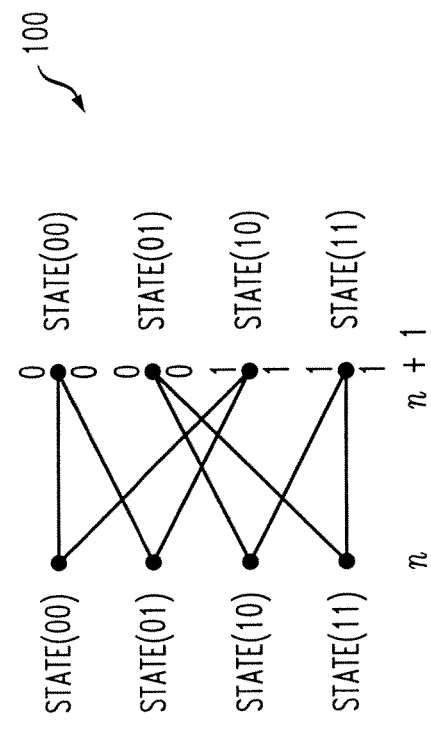
FIG. 1 illustrates a one-step trellis diagram for a channel with memory L=2.

FIG. 1 shows a one-step trellis 100, where a state is defined by the two most recent state bits $b_0 b_{-1}$, and denoted as state $(b_0 b_{-1})$. This trellis corresponds e.g. to an ISI channel with memory L=2. The bit $b_0$ is associated with the transition:
state$(b_{-1} b_{-2}) \rightarrow$ state$(b_0 b_{-1})$.

Figure 2:
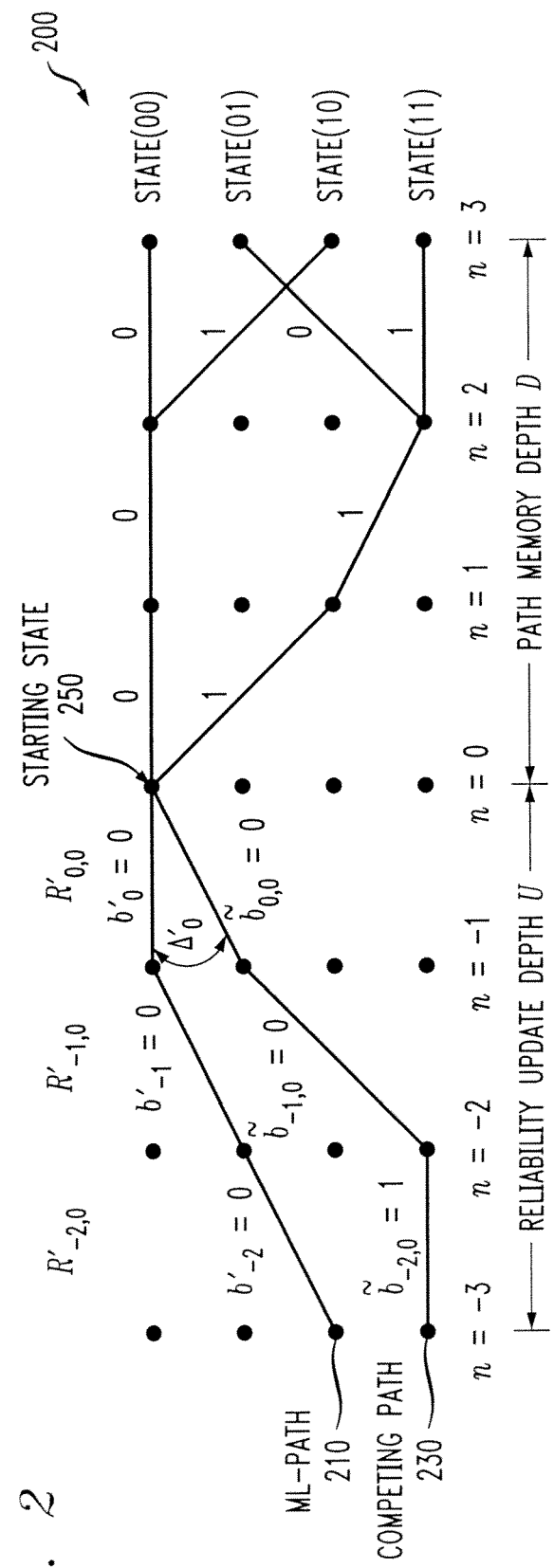
FIG. 2 illustrates the two-step SOVA for the one-step trellis shown in FIG. 1.

FIG. 2 illustrates the two-step SOVA for an expanded version 200 of the trellis 100 shown in FIG. 1. The two-step SOVA is explained, e.g., in O. J. Joeressen and H. Meyr, "A 40 Mb/s Soft-Output Viterbi Decoder," IEEE Journal of Solid-State Circuits, Vol. 30, 812-18 (July, 1995). The first step of the two-step SOVA determines the maximum likelihood (ML) path 210 in FIG. 2, in a similar manner to the conventional Viterbi algorithm. FIG. 2 illustrates the steady-state of the Viterbi algorithm at time step n=3, after the four survivor paths into all four states $\{state(b_3 b_2)\}$ have been determined. The starting state 250 $\{state(b_0 b_{-1})\}$ of the ML path 210 can be identified by a D-step trace-back from the $\{state(b_D b_{D-1})\}$ with the minimum path metric, where D is the path memory depth of the survivor memory unit. In the example of FIG. 2, it is assumed that D=3.

In the second step of the two-step SOVA, the reliabilities for the bit decisions along the ML path 210 terminating in the starting state state$(b_0 b_{-1})$ are updated. The reliability update depth is denoted by U.

Let $b'_0, b'_{-1}, \ldots$ denote the state bits for the ML path 210 that terminates in the starting state state $(b'_0, b'_{-1})$. Also, let $\tilde{b}_0, \tilde{b}_{-1}, \ldots$ denote the state bits for the competing, losing path 230 in FIG. 2 that terminates in the starting state, state$(\tilde{b}_0, \tilde{b}_{-1})$=state$(b'_0, b'_{-1})$.

The absolute path metric difference between the ML path 210 and competing path 230 into the starting state, state$(b'_0, b'_{-1})$, is denoted by $\Delta'_0$. The U intermediate reliabilities for the bits $b'_0, b'_{-1}, \ldots, b'_{-U+1}$ that are updated using $\Delta'_0$ are denoted by $R'_{0,0}, R'_{-1,0}, \ldots, R'_{-U+1,0}$, respectively. The reliabilities are updated according to following rule:

$$\text{initialization: } R'_{0,-1} = +\infty,$$

$$i = 0, -1, \ldots, -U+1: R'_{i,0} = \begin{cases} \min(R'_{i,-1}, \Delta'_0) & \text{if } b'_i \neq \tilde{b}_{i,0}, \\ R'_{i,-1} & \text{otherwise,} \end{cases}$$

$$R'_{-U+1} = R'_{-U+1,0}.$$

where $R'_{-1,-1}, R'_{-2,-1}, \ldots, R'_{-U+1,-1}$ are the intermediate reliabilities that were updated in the previous clock cycle using the path metric difference $\Delta'_{-1}$ for the starting state state$(b'_{-1}, b'_{-2})$, and $R'_{-U+1}$ is the final reliability for bit $b'_{-U+1}$.

It can be seen from the updating formula that the reliability for bit $b'_0$ is first initialized to infinity ($R'_{0,-1}=+\infty$). Then, as the starting state 250 for the ML path 210 moves from state $(b'_0, b'_{-1})$ to state$(b'_{U-1}, b'_{U-2})$, and as corresponding absolute path metric differences $\Delta'_0$ to $\Delta'_{U-1}$ become available, the reliability for bit $b'_0$ is updated U times by using either the previous reliability, if the bit $b'_0$ agrees with the bit of the respective competing path, or using the minimum of the path metric difference and previous reliability.

The updating of reliabilities is shown in FIG. 2 for U=3, where the ML path 210 and competing path 230 merge into the starting state state$(b'_0, b'_{-1})$=state$(00)$, and the intermediate reliabilities $R'_{0,0}, R'_{-1,0}$, and $R'_{-2,0}$ are updated based on the path metric difference $\Delta'_0$ and the respective intermediate reliabilities from the previous updating procedure, i.e. $R'_{-1,-1}$ and $R'_{-2,-1}$. In the example of FIG. 2, only $R'_{-2,0}$ is updated by taking the minimum of $R'_{-2,-1}$ and $\Delta'_0$, as the $b'_{-2}$ and $\tilde{b}_{-2,0}$ differ from each other.

SOVA Architecture for a One-Step Trellis

Figure 3:
FIG. 3 is a schematic block diagram for a SOVA implementation employing a one-step trellis.

FIG. 3 is a schematic block diagram showing a SOVA detector for a one-step trellis 300 (referred to in the following as a one-step-trellis SOVA detector). As shown in FIG. 3, a one-step-trellis SOVA detector 300 processes a received signal to generate soft decisions, in a well known manner. Each soft decision includes the detected bit and a corresponding reliability value. The SOVA detector 300 generates soft decisions at the same rate, $f_S$, at which the input signals are received, $f_R$. For a more detailed discussion of the SOVA, see, for example, J. Hagenauer and P. Hoeher, "A Viterbi Algorithm with Soft-Decision Outputs and its Applications," IEEE Global Telecommunications Conference (GLOBECOM), vol. 3, 1680-1686 (November, 1989).

SOVA Detection at Higher Data Rates

Figure 4:
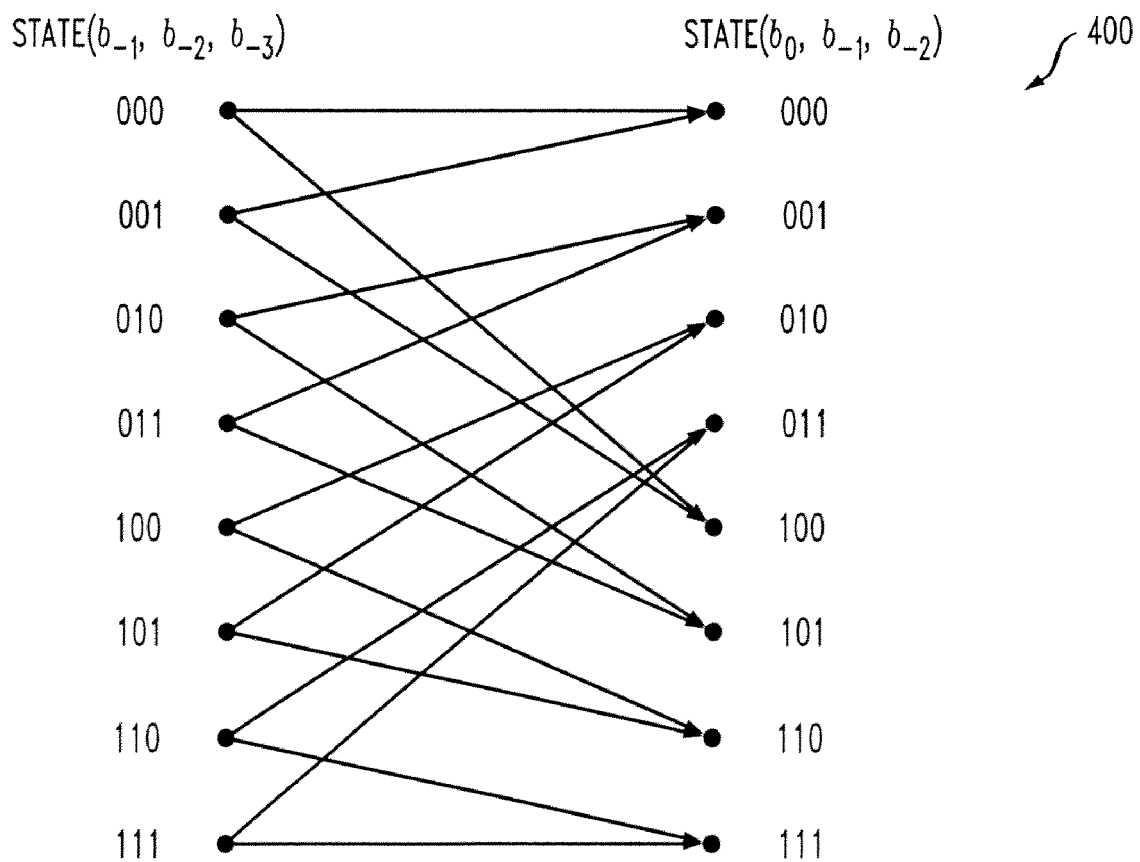
FIG. 4 illustrates a one-step trellis for a channel with memory L=3.

FIG. 4 illustrates a one-step trellis 400 for an ISI channel having a memory L=3. There are eight channel states, and two branches corresponding to the bits $b_n=0$ and $b_n=1$ leave each state, state($b_{-1}b_{-2}b_{-3}$), to reach a respective successor state, state($b_0b_{-1}b_{-2}$).

Figure 5:
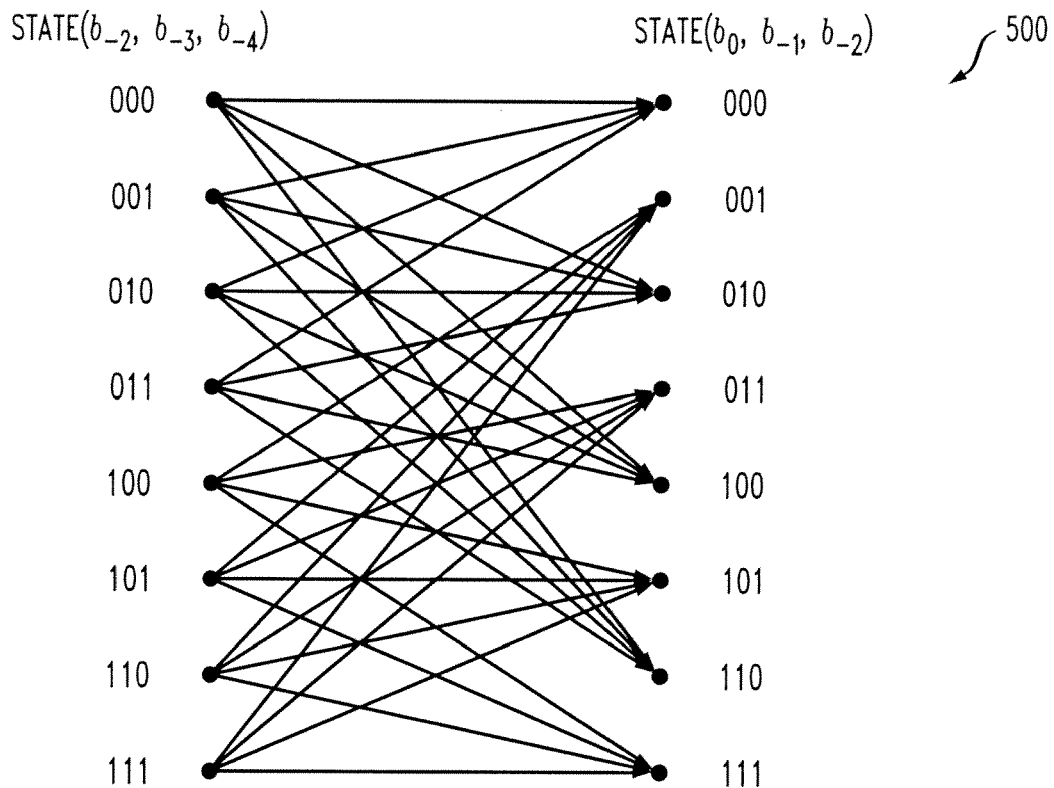
FIG. 5 illustrates a two-step trellis for a channel with memory L=3.

As previously indicated, the present invention increases the maximum data rate that may be achieved by a SOVA detector by transforming the original one-step trellis 400 into a multiple-step trellis 500, shown in FIG. 5. FIG. 5 illustrates an exemplary two-step trellis 500 for an ISI channel having a memory L=3, corresponding to the one-step trellis 400 of FIG. 4, in accordance with the present invention. The trellises in both FIGS. 4 and 5 are for the illustrative case that the channel memory is equal to L=3. While the present invention is described using the exemplary two-step trellis 500 of FIG. 5, the invention generalizes to cases where more than two steps are processed at once in a multiple-step trellis, as would be apparent to a person of ordinary skill in the art. As shown in FIG. 5, when one step is processed in the two-step trellis 500, two steps from the original one-step trellis 400 are processed at once. In this manner, if a two-step trellis is used, the maximum data rate that can be achieved in a hardware implementation is effectively increased by a factor of about two compared to a one-step-trellis implementation. A higher data rate increase can be achieved if more than two steps from the original one-step trellis are processed at once in the multiple-step trellis.

SOVA Architecture for a Two-Step Trellis

Figure 6:
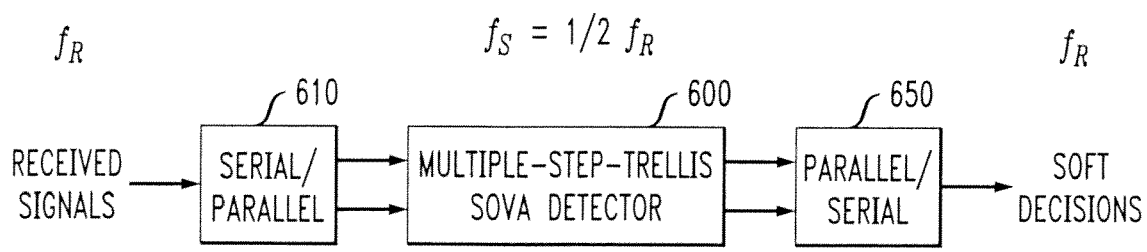
FIG. 6 a schematic block diagram showing a SOVA implementation for a two-step trellis.

FIG. 6 is a schematic block diagram showing a SOVA implementation for a two-step trellis 600 (also referred to in the following as a two-step-trellis SOVA detector) incorporating features of the present invention. As shown in FIG. 6, the serial received signal is converted to a parallel signal at stage 610 and the parallel signals are processed by the two-step-trellis SOVA detector 600, for example, using the exemplary implementation discussed below in conjunction with FIG. 7. The two-step-trellis SOVA detector 600 generates the detected bits and reliabilities at half the rate, $f_S=\frac{1}{2} \cdot f_R$, at which the input signals are received, $f_R$. Thus, two soft decisions are generated per clock cycle. The parallel output of the two-step trellis SOVA detector 600 may be converted to a serial signal at stage 650.

Figure 7:
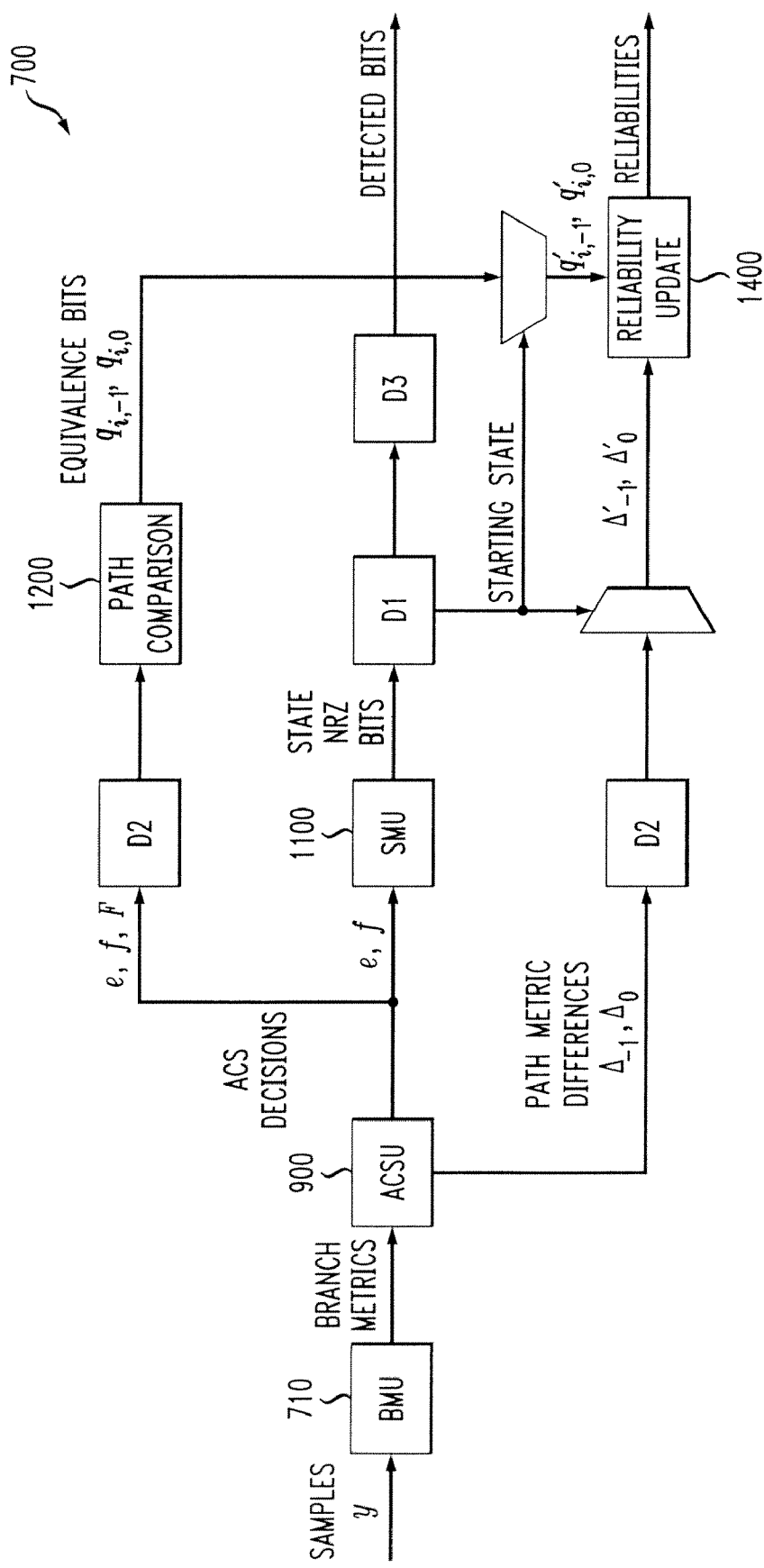
FIG. 7 illustrates a detailed schematic block diagram of a SOVA implementation for a two-step trellis.

FIG. 7 illustrates a schematic block diagram of an exemplary two-step SOVA architecture 700 for a two-step trellis incorporating features of the present invention. As shown in FIG. 7, the exemplary SOVA architecture 700 for a two-step trellis comprises a branch metric unit (BMU) 710.

The BMU 710 is explained for the two-step trellis shown in FIG. 5 without loss of generality. The BMU 710 computes one-step-trellis branch metrics, m(0000), m(0001), . . . , m(1111), as follows:

$$m(b_0 b_{-1} b_{-2} b_{-3}) = [y - e(b_0 b_{-1} b_{-2} b_{-3})]^2,$$

where the subtracted term $e(b_0 b_{-1} b_{-2} b_{-3})$ is the ideal (noiseless) channel output under the condition that the state bit block (on which the ideal output depends) is $b_0 b_{-1} b_{-2} b_{-3}$.

In each two-step-trellis clock cycle, each one-step-trellis branch metric is used as a summand in two distinct two-step-trellis branch metrics. The two-step-trellis branch metric for the 5 state bits $b_0 b_{-1} b_{-2} b_{-3} b_{-4}$, where $b_0$ is the most recent bit at the later one-step-trellis period of the two-step-trellis cycle, is given by:

$$m_{branch}(b_0 b_{-1} b_{-2} b_{-3} b_{-4}) = m(b_{-1} b_{-2} b_{-3} b_{-4}) + m(b_0 b_{-1} b_{-2} b_{-3}).$$

In addition, the exemplary two-step-trellis SOVA architecture 700 comprises an add-compare-select unit (ACSU) 900, discussed below in conjunction with FIGS. 9 and 10, a survivor memory unit (SMU) 100, discussed below in conjunction with FIG. 11, a path comparison unit 1200, discussed below in conjunction with FIGS. 12 and 13, a reliability unit 1400, discussed below in conjunction with FIG. 14, and a number of delay operators D1-D3.

The BMU 710, ACSU 900, and SMU 1100 implement the first step of the two-step SOVA, i.e., maximum-likelihood sequence detection using the Viterbi algorithm. The second step of the two-step SOVA is implemented by the path comparison unit 1200, which computes the paths that compete with a respective win-win path, and the reliability update unit 1400, which updates the reliabilities for the ML path.

Path Metric Difference and ACS Decision Definitions

A conventional one-step-trellis SOVA implementation computes one absolute path metric difference per state at each (one-step-trellis) clock cycle, as described, e.g., in O. J. Joeressen and H. Meyr, "A 40 Mb/s Soft-Output Viterbi Decoder," IEEE Journal of Solid-State Circuits, Vol. 30, 812-18 (July, 1995). The present invention recognizes that in the exemplary implementation for a two-step trellis, where two steps from the original one-step trellis 400 are processed at once, two path metric differences are computed per state at each (two-step-trellis) clock cycle. Thus, as discussed below in conjunction with FIG. 9 and FIG. 10, the ACSU 900 generates, for each state, two path metric differences $\Delta_{-1}$ and $\Delta_0$ for the first and second period of the (two-step-trellis) clock cycle.

Figure 8:
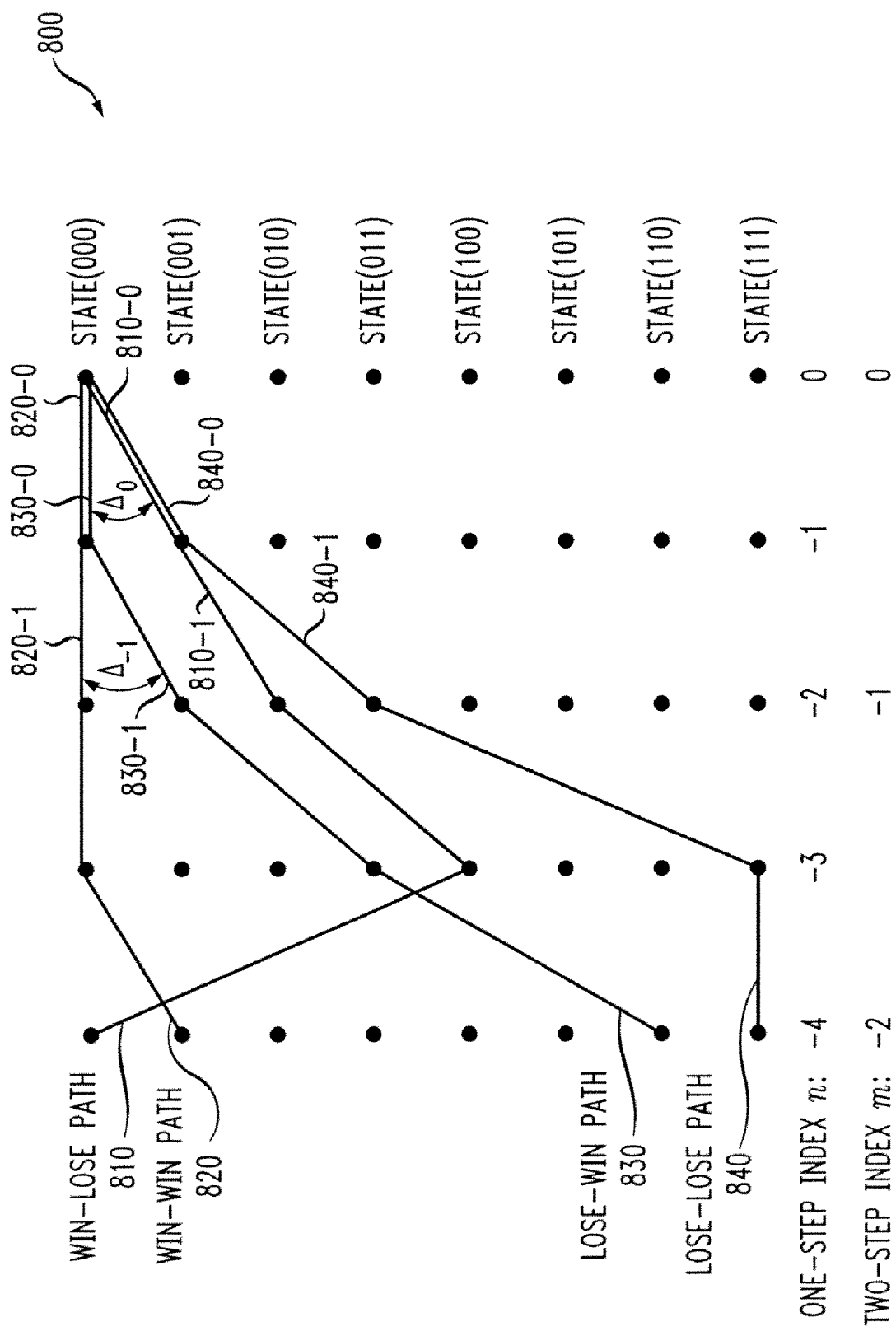
FIG. 8 illustrates the path metric differences computed by a SOVA detector for a two-step trellis.

FIG. 8 illustrates the computation of the path metric differences $\Delta_{-1}$ and $\Delta_0$ in a two-step-trellis SOVA detector 600 for the exemplary one-step and two-step trellises 400 and 500, where n is the one-step-trellis time index and m is the two-step-trellis time index. In a two-step-trellis SOVA implementation, each two-step-trellis cycle contains two one-step-trellis periods. For example, as shown in FIG. 8, the cycle associated with the two-step-trellis index m=0 contains the two one-step-trellis periods associated with the one-step-trellis indices n=0 and n=−1. FIG. 8 shows four competing paths 810, 820, 830, 840. Each path 810, 820, 830, 840 can be identified with a respective two-bit selection signal indicating whether the path wins or loses in each one-step-trellis period of the two-step-trellis cycle into the state that terminates in the state defined by the 3-bit block $b_0 b_{-1} b_{-2}=000$. For example, the win-lose path 810 wins (relative to the lose-lose path) in the first period (n=−1) and loses (relative to the win-win path) in the second period (n=0) of the two-step-trellis cycle.

FIG. 8 shows the four competing paths 810, 820, 830 and 840 that terminate in the state defined by the 3-bit block $b_0 b_{-1} b_{-2}=000$.

The path metric difference $\Delta_0$ for the second period of the two-step-trellis cycle, into the state associated with the onestep-trellis index n=0, is the difference between the win-win path segment 820-0 and the win-lose path segment 810-0. The path metric difference $\Delta_{-1}$ for the first period of the two-step-trellis cycle, into the respective state associated with the one-step-trellis index n=−1, is the difference between the win-win path segment 820-1 and the lose-win path segment 830-1.

In a conventional one-step-trellis SOVA implementation, the ACS generates a single ACS decision, e, indicating, for each state, which branch to trace back along the winning path through the trellis. According to an exemplary convention, a value of e=0 provides an indication to trace back the upper branch from a state. The present invention recognizes that in a two-step-trellis SOVA implementation, the ACS 900 needs to generate, for each two-step-trellis cycle, two-bit ACS decisions ef, indicating, for each two-step-trellis cycle, which branches to trace back along the win-win path through the trellis, where e corresponds to the first period and f to the second period of the two-step-trellis cycle. Thus, a two-bit ACS decision of ef=00 provides an indication to trace back the upper branches out of the state that terminates in the state defined by the 3-bit block $b_0 b_{-1} b_{-2}$=000 through the trellis 800 along the win-win path 820 to the state defined by the 3-bit block $b_{-2} b_{-3} b_{-4}$=000.

Again, the path metric difference $\Delta_0$ for the second period of the two-step-trellis cycle is the difference between the win-win path segment 820-0 and the win-lose path segment 810-0. Similarly, the path metric difference $\Delta_{-1}$ for the first period of the two-step-trellis cycle is the difference between the win-win path segment 820-1 and the lose-win path segment 830-1. Thus, to compute the path metric differences, $\Delta_0$ and $\Delta_{-1}$, three different paths need to be distinguished (win-win path 820, win-lose path 810, and lose-win path 830). The two-bit ACS decisions ef, however, only allows two of these paths to be distinguished. The win-win path 820 can be identified using the two-bit ACS decision ef=00. The lose-win path 830 can be identified using the two-bit selection signal e$\bar{f}$=01, which can be derived from the ACS decision by using e and inverting f ($\bar{f}$ denotes the inversion of f). While the second win-lose path segment 810-0 can be identified in terms of the ACS decision e, i.e. by $\bar{e}$=1, the first win-lose path segment 810-1 cannot be identified in terms of the ACS decision, f. Thus, in order to sufficiently define the win-lose path 810 through the two-step trellis, an additional selection signal F is generated, as discussed further below.

The best path, i.e., the win-win path 820 into state($b_0 b_{-1} b_{-2}$) is given by the bit sequence $b_0 b_{-1} b_{-2} b_{-3} b_{-4}$=$b_0 b_{-1} b_{-2}$ef=00000.

The lose-win-path 830 is thus the path that lost to the win-win path 820 in the first period of the two-step-trellis cycle and then became part of the win-win path 820. This path 830 is given by the bit sequence $b_0 b_{-1} b_{-2} b_{-3} b_{-4}$=$b_0 b_{-1} b_{-2}$e$\bar{f}$=00001, and it can be traced back from state($b_0 b_{-1} b_{-2}$) to state($b_{-1} b_{-2}$e), and then from state($b_{-1} b_{-2}$e) to state($b_{-2}$e$\bar{f}$) using the ACS decision e and the inverted ACS decision $\bar{f}$. The path metric difference $\Delta_{-1}$ is defined as the path metric difference between the win-win path segment 820-1 and the lose-win path segment 830-1.

The win-lose-path 810 is the winning path into state($b_{1-1} b_{-2} \bar{e}$) and the losing path into state($b_0 b_{-1} b_{-2}$). Denote the one-step-trellis ACS decision for the two paths into state state($b_{-1} b_{-2} \bar{e}$) by F. Then, the win-lose-path 810 can be traced back from state($b_0 b_{-1} b_{-2}$) to state($b_{-1} b_{-2} \bar{e}$) and then to state($b_{-2} \bar{e} F$). In the example of FIG. 8, the win-lose path 810 is given by the state sequence $b_0 b_{-1} b_{-2} b_{-3} b_{-4}$=$b_0 b_{-1} b_{-2}$ $\bar{e}F$=00010. The path metric difference $\Delta_0$ is defined as the path metric difference between the win-win path segment 820-0 and win-lose path segment 810-0.

The lose-lose-path 840 can be traced back from state($b_0 b_{-1} b_{-2}$) to state($b_{-1} b_{-2} \bar{e}$) and state($b_{-2} \overline{eF}$), but it is not of importance for the computation of the path metric differences $\Delta_{-1}$ and $\Delta_0$.

In summary, for each state($b_0 b_{-1} b_{-2}$) two path metric differences $\Delta_{-1}$ and $\Delta_0$ are computed, the former for the first period and the latter for the second period of a two-step-trellis cycle. The lose-win path 830 can be traced back from state ($b_0 b_{-1} b_{-2}$) to state($b_{-2}$e$\bar{f}$) using the two-bit selection signal e $\bar{f}$, and the win-lose path 810 can be traced from state($b_0 b_{-1} b_{-2}$) to state($b_{-2} \bar{e} F$) using the two-bit selection signal $\bar{e}F$.

Returning to FIG. 7, the path metric differences $\Delta_0$ and $\Delta_{-1}$, and the ACS decisions e, f and F are delayed in the delay buffers D2 for a time that is equal to the delay of the path memory and the delay buffer D1. The path comparison unit 1200 generates, for each state and bit within the reliability update window, an equivalence bit that indicates whether the win-win path and a respective competing path agree in terms of the bit decision. The path metric differences and equivalence bits that correspond to the starting state of the ML path are selected based on a selection signal that is defined by the state bits in the delay buffer D1. The state bits for the ML path at the output of SMU are first stored in the delay buffer D1 and then in the delay buffer D3.

ACSU

Figure 9:
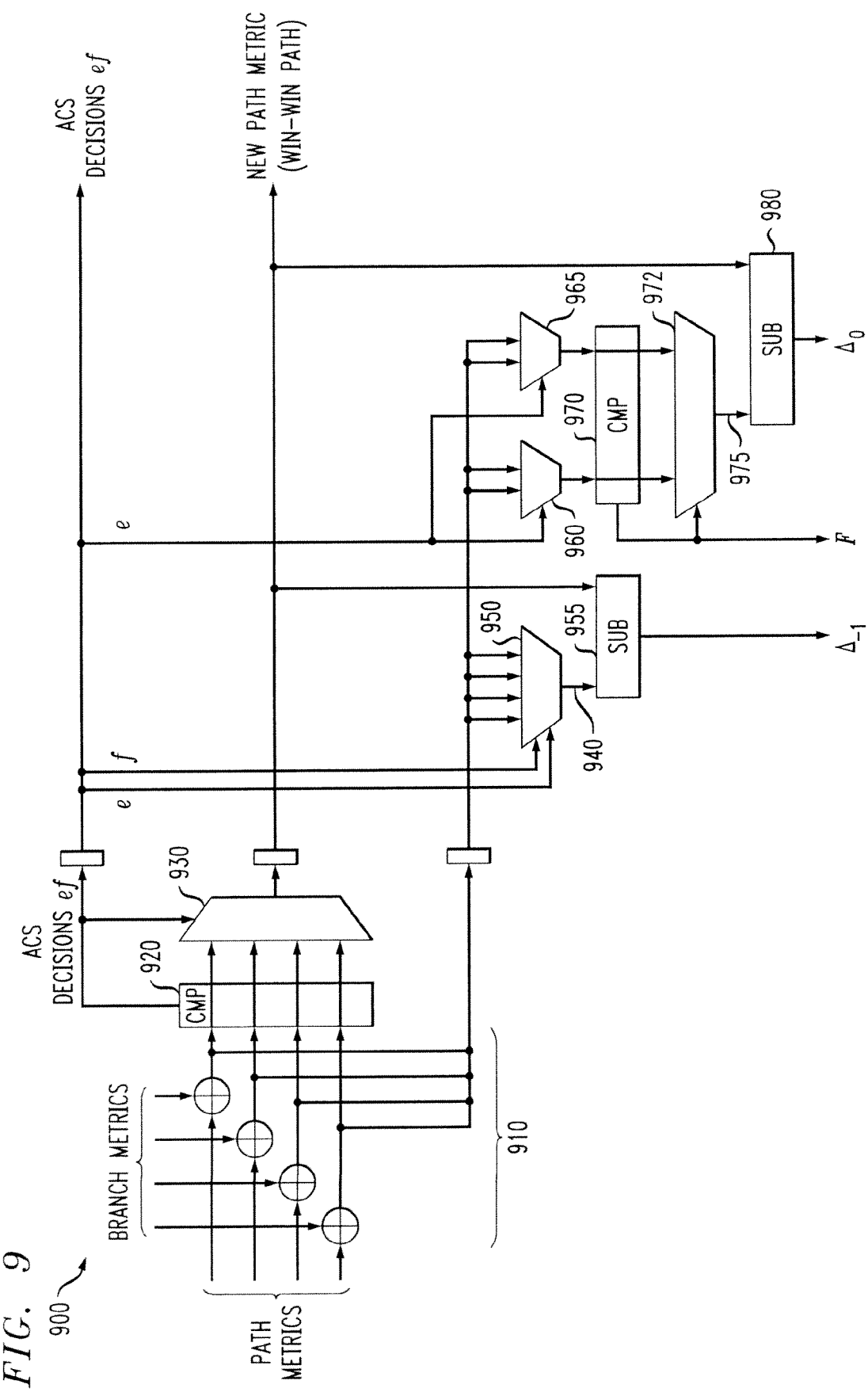
FIG. 9 is a schematic block diagram showing an exemplary implementation of the ACS operation of FIG. 7 and the generation of path metric differences $\Delta_{-1}$ and $\Delta_0$.

FIG. 9 is a schematic block diagram showing an exemplary implementation of the ACSU 900 of FIG. 7 and the generation of path metric differences $\Delta_{-1}$ and $\Delta_0$ and the additional ACS decision F. The exemplary ACSU 900 considers an 8-state two-step trellis with 4 transitions per state, such as the trellis 500 shown in FIG. 5, in which each state is defined by the past 3 state bits $b_0 b_{-1} b_{-2}$. Each two-step-trellis branch metric $m_{branch}(b_0 b_{-1} b_{-2} b_{-3} b_{-4})$ depends on the 3 state bits $b_{-2} b_{-3} b_{-4}$ that define the starting state of a transition in the two-step trellis 800, and also on the 2 state bits $b_0 b_{-1}$ that correspond to the path extension. The path metric for above path extension is computed by:

$$m'_{path}(b_0 b_{-1} b_{-2} b_{-3} b_{-4}) = m_{path}(b_{-2} b_{-3} b_{-4}) + m_{branch}(b_0 b_{-1} b_{-2} b_{-3} b_4),$$

where $m_{path}(b_{-2} b_{-3} b_{-4})$ is the path metric for the winning path into state state($b_{-2} b_{-3} b_{-4}$) at the previous two-step-trellis cycle.

For each state, the ACSU performs the ACS operation to determine the winning path using a set of adders 910, a comparator 920 and a selector 930. For example, for state (000), the four path metrics for the path extensions into this state are computed as $$m'_{path}(00000) = m_{path}(000) + m_{hrate}(00000)$$

$$m'_{path}(00010) = m_{path}(010) + m_{hrate}(00010)$$

$$m'_{path}(00001) = m_{path}(001) + m_{hrate}(00001)$$

$$m'_{path}(00011) = m_{path}(011) + m_{hrate}(00011)$$

The path metric for the winning path 820 into state($b_0 b_{-1} b_2$) is determined with a 4-way comparison 920 among the path metrics for the 4 path extensions into this state, i.e., it is the minimum of the 4 values $m'_{path}(b_0 b_{-1} b_{-2} 00)$, $m'_{path}(b_0 b_{-1} b_{-2} 10)$, $m'_{path}(b_0 b_{-1} b_{-2} 01)$, and $m'_{path}(b_0 b_{-1} b_{-2} 11)$.

In the ACSU 900, the path metric differences $\Delta_{-1}$ and $\Delta_0$ are computed after the two-step-trellis ACS operation, as shown in FIG. 9. The two-bit, two-step-trellis ACS decision ef generated by the comparator 920 is used to select the path metric for the winning path (also referred to as the win-win path 820) at the selector 930 as in a conventional two-step-trellis ACSU. The path metric 940 of the lose-win path 830 is chosen by a selector 950 using the 2-bit selection signal ef. The path metric difference $\Delta_{-1}$ is computed by taking the absolute value of the difference between the path metric of the win-win path 820 and lose-win path 830, as computed by a subtractor 955.

The win-lose path 810 and lose-lose path 840 are chosen using two 2-to-1 multiplexers 960, 965, based on the selection signal $\bar{e}$. This is equivalent to selecting the win-lose and lose-lose path 840 using two 4-to-1 multiplexers that are driven by the 2-bit selection signals $\bar{e}0$ and $\bar{e}1$ respectively. The two selected path metrics are compared by a comparator 970 to identify the path metric 975 of the win-lose path 810, and the corresponding ACS decision F is generated. The path metric 975 is selected by the selector 972. The path metric difference $\Delta_0$ is computed by a subtractor 980 that computes the absolute value of the difference between the path metric of the win-win path 820 and win-lose path 810.

Figure 10:
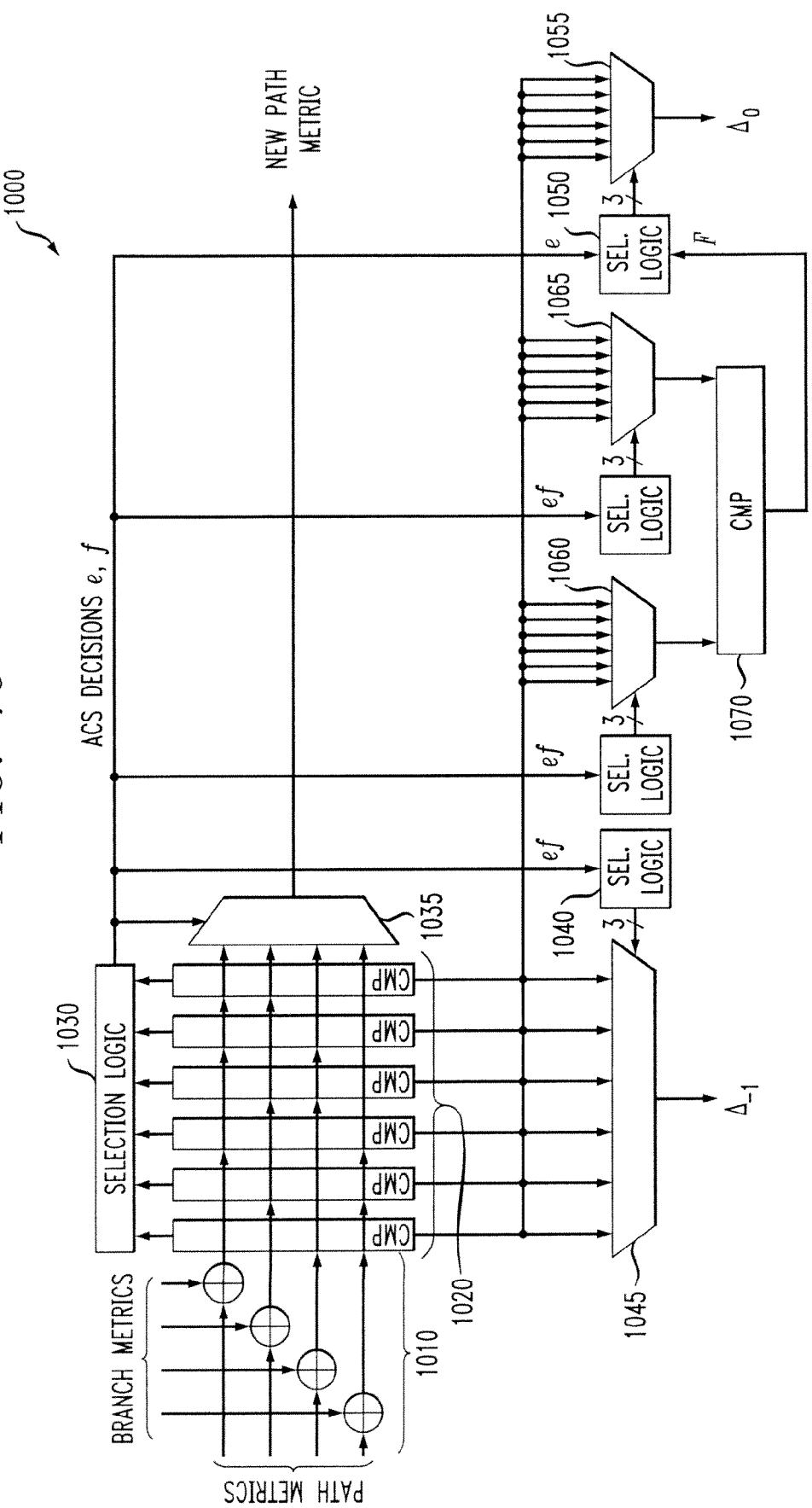
FIG. 10 is a schematic block diagram showing an alternate implementation of the ACS operation of FIG. 7 and the generation of the path metric differences $\Delta_{-1}$ and $\Delta_0$.

FIG. 10 shows an alternate implementation of the ACS operation and generation of the path metric differences $\Delta_{-1}$ and $\Delta_0$. For each state, the ACSU 1000 performs the ACS operation to determine the winning path using a set of adders 1010, a set of comparators 1020, selection logic and a selector 1030. The path metric for the winning path 820 into state($b_0 b_{-1} b_2$) is determined with six parallel concurrent two-way comparisons 1020. For a more detailed discussion of the implementation of the ACS operation for multiple-step trellises using parallel concurrent comparisons, see U.S. patent application Ser. No. 10/853,087, entitled "Method and Apparatus for Multiple-Step Viterbi Detection with Local Feedback," filed on May 25, 2004 and incorporated by reference herein.

In the ACSU 1000, the path metric differences $\Delta_{-1}$ and $\Delta_0$ are selected or computed after the two-step-trellis ACS operation, as shown in FIG. 10. The two-bit, two-step-trellis ACS decision ef generated by the selection logic 1030 is again used to select the path metric for the winning path (also referred to as the win-win path 820) by a selector 1035 as in a conventional two-step-trellis ACSU. The path metric difference $\Delta_{-1}$ is selected by a selector 1045 (controlled by selection logic 1040 that processes the 2-bit ACS decision ef) that selects the output of the appropriate comparator 1020 that produced the absolute value of the difference between the path metric of the win-win path 820 and lose-win path 830.

Similarly, the path metric difference $\Delta_0$ is selected by a selector 1055 (controlled by selection logic 1050 that processes the first bit, e, of the 2-bit ACS decision ef and the selection signal F) that selects the output of the appropriate comparator 1020 that produced the absolute value of the difference between the path metric of the win-win path 820 and win-lose path 810.

The ACS decision F is generated in the ACSU 1000 as follows. The path metric difference between the win-win path 820 and win-lose path 810 and the path metric difference between the win-win-path 820 and the lose-lose path 840 are chosen using two selectors 1060, 1065, each of which is controlled by selection logic that processes the 2-bit ACS decision ef. The two selected path metric differences are compared by a comparator 1070 to generate the corresponding ACS decision F.

SMU

Figure 11:
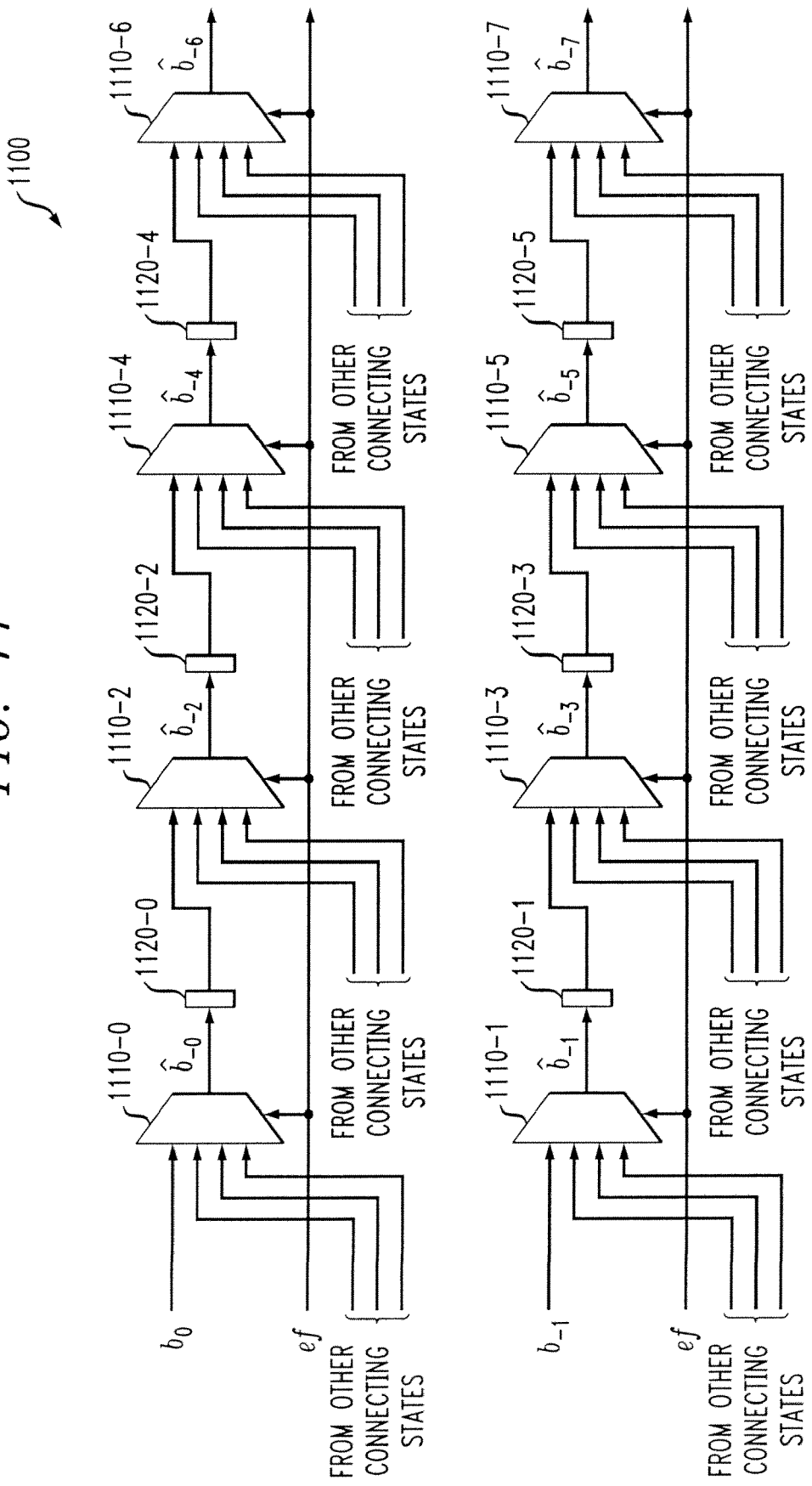
FIG. 11 is a schematic block diagram showing an exemplary implementation of the survivor memory unit of FIG. 7.

FIG. 11 is a schematic block diagram showing an exemplary implementation of the survivor memory unit 1100 of FIG. 7. Generally, the SMU 1100 stores and updates the state bits for all 8 survivor paths using a conventional register-exchange architecture, where the multiplexers 1110 are controlled by the two-bit, two-step-trellis ACS decision ef. FIG. 11 shows the double row of the survivor memory unit 1100 that stores the odd and even state bits $\hat{b}_0, \hat{b}_{-1}, \hat{b}_{-2}, \hat{b}_{-3}, \hat{b}_{-4}, \hat{b}_{-5}, \ldots$ along the survivor path into state($b_0 b_{-1} b_{-2}$) state (000). The top row in the exemplary embodiment processes the predefined state bit $b_0$ and corresponding predefined state bits from other states, under control of the ACS decision ef, whereas the bottom row processes the predefined state bit $b_{-1}$ and corresponding predefined state bits from other states, under control of the ACS decision ef. A double row structure similar to the one of FIG. 11 is implemented for all 8 states. Per state and stored survivor bit pair, the SMU 1100 implements two multiplexers 1110 and two registers 1120 as a constituent functional unit. The SMU 1100 produces at the output the final survivor bits $\hat{b}_{-D+2}$ and $\hat{b}_{-D+1}$, where D is the path memory depth. In the exemplary embodiment 1100, D=8. For a discussion of the register-exchange SMU architecture, see, e.g., R. Cypher and C. B. Shung, "Generalized Trace-Back Techniques for Survivor Memory Management in the Viterbi Algorithm," Journal of VLSI Signal Processing, 85-94 (1993).

The ML path 820 is the path with the overall minimum path metric. The survivor bits $\hat{b}_{-D+2}$ and $\hat{b}_{-D+1}$ that correspond to the state with the overall minimum path metric are provided to the delay buffer D1 (FIG. 7) and denoted as $b'_{-D+2}$ and $b'_{-D+1}$. These bits are the state bits for the ML path 820, and they both determine the starting state for the reliability update operation and also the final bit decisions.

Delay Buffers D1, D2, and D3

As previously indicated, the two-step-trellis SOVA architecture 700 of FIG. 7 comprises a number of delay buffers D1-D3. The delay buffer D1 delays the state bits at the end of the SMU 1100 that belong to the ML path 820 by two two-step-trellis clock cycles. The final three bits of this buffer D1 define the starting state for the second step of the two-step SOVA. The starting state signal is used to select the path metric differences and equivalence bits for the ML path.

The ACS decisions e, f, F and the path metric differences $\Delta_{-1}, \Delta_0$ for all states are also delayed in the delay buffers D2. The delay of D2 is equal to the sum of the delay of the path memory and the buffer D1. The delay buffer D3 further delays the state bits that are outputted by the buffer D1. The delay of D3 is equal to the delay of the reliability update unit.

Path Comparison Unit

Figure 12:
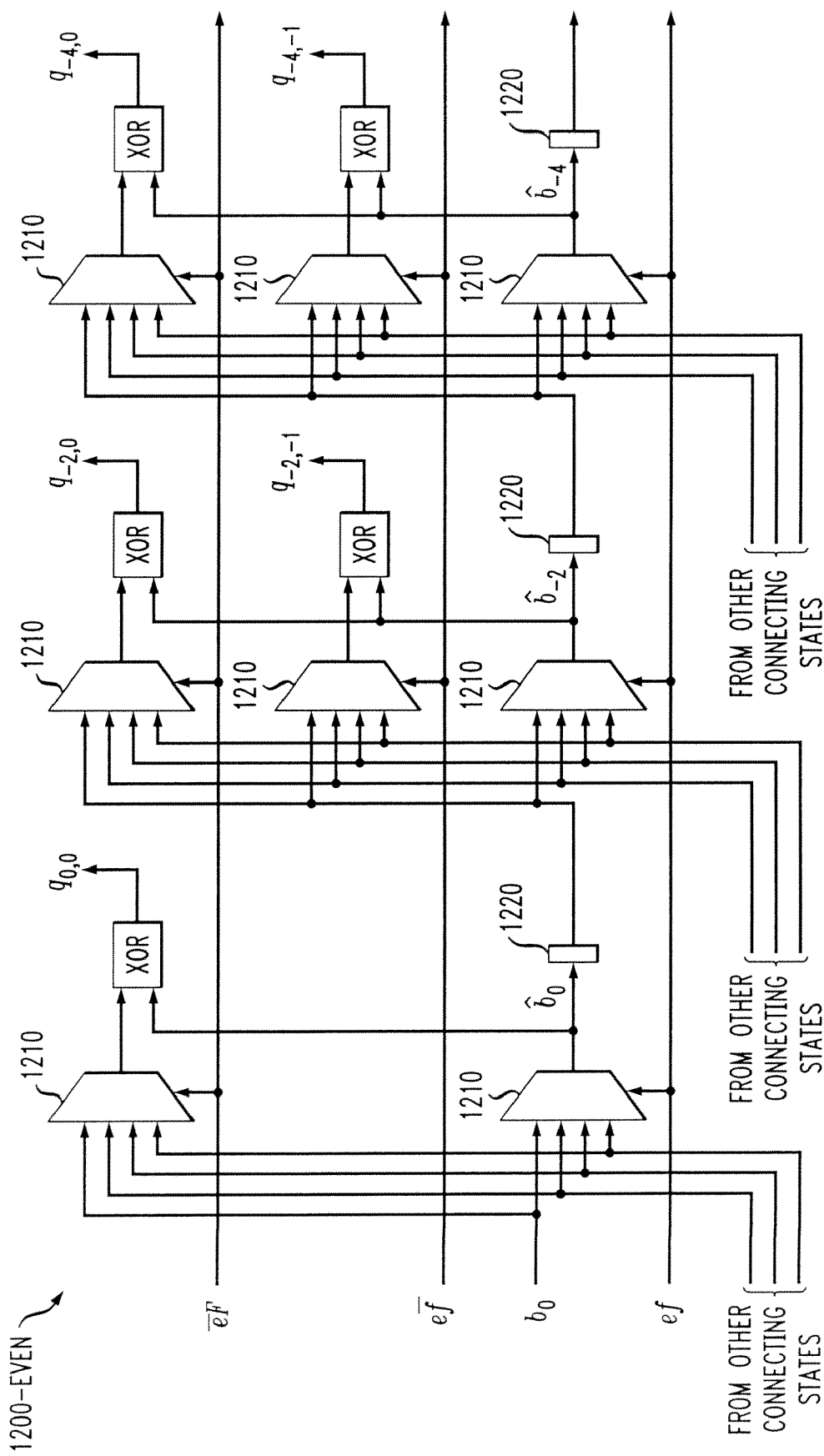
FIG. 12 is a schematic block diagram showing an exemplary implementation of the path comparison of FIG. 7 for bits corresponding to even one-step-trellis periods.
Figure 13:
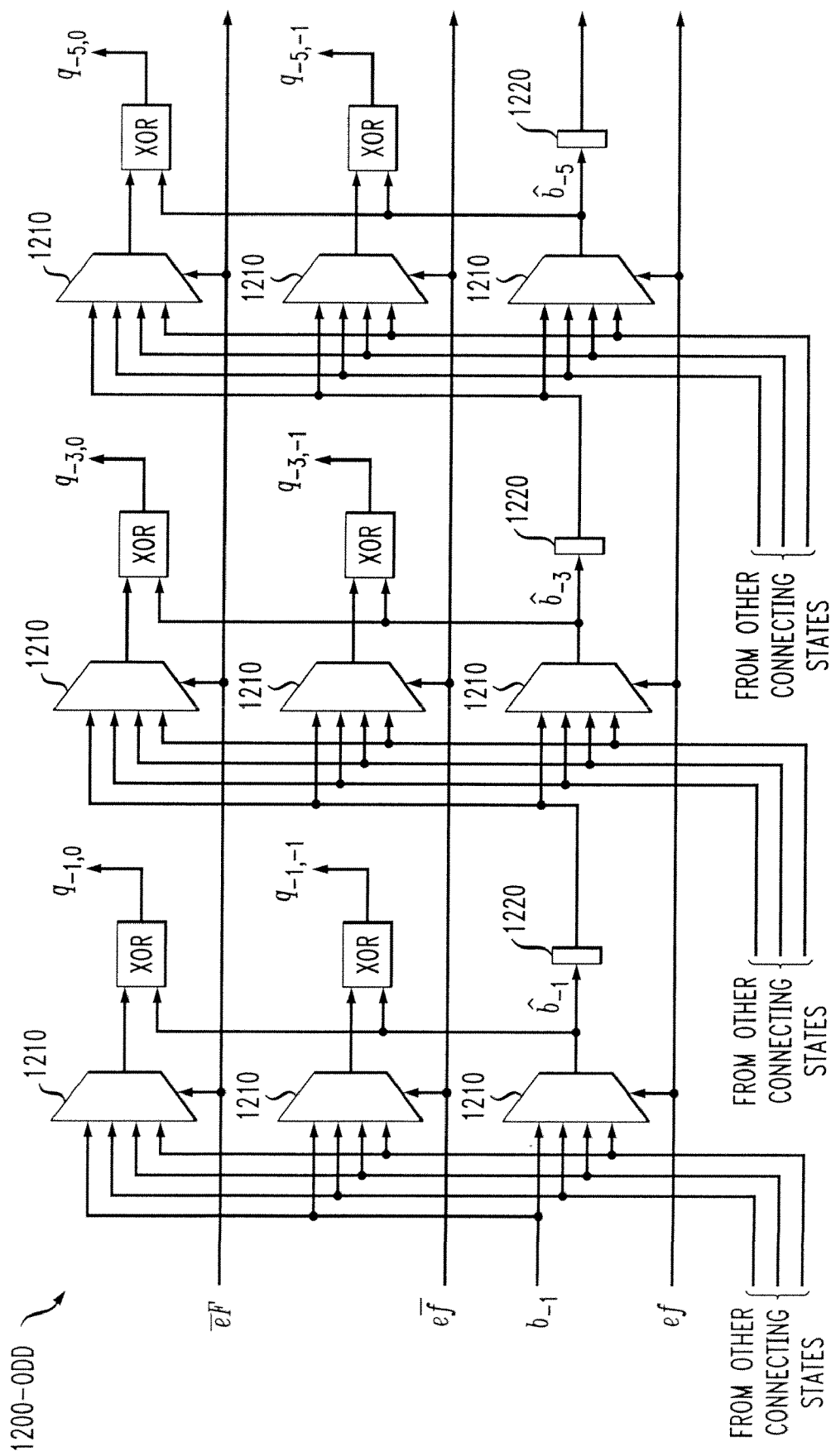
FIG. 13 is a schematic block diagram showing an exemplary implementation of the path comparison of FIG. 7 for bits corresponding to odd one-step-trellis periods.

As previously indicated, the path comparison unit 1200, shown in FIG. 12 and FIG. 13, computes for each state the paths that compete with the survivor path, i.e., win-win path 820. In addition, the path comparison unit 1200 generates, for each state and bit within the reliability update window, an equivalence bit that indicates whether the win-win path 820 and a competing path agree in terms of the bit decision. In FIGS. 12 and 13, only the rows for state($b_0 b_{-1} b_{-2}$)=state(000) are shown.

FIG. 12 is a schematic block diagram showing an exemplary implementation of the path comparison unit 1200-even for bits corresponding to even one-step-trellis periods and FIG. 13 is a schematic block diagram showing an exemplary implementation of the path comparison unit 1200-odd for bits corresponding to odd one-step-trellis periods (collectively referred to as the path comparison unit 1200). The path comparison unit 1200 receives at each two-step-trellis cycle for each state the delayed ACS decisions e, f and F, from which the selection signals ef, ef̄ and ēF are derived. The path comparison unit 1200 stores and updates the bits that correspond to all survivor paths. The path comparison unit 1200 also computes equivalence bits for each surviving bit: an equivalence bit is 1 if the bit for the survivor path 820 and competing path disagree, and 0 otherwise.

The survivor bits $b_0, b_{-1}, b_{-2}, b_{-3}, b_{-4}, b_{-5}, \ldots$ are generated as shown in FIG. 12 for even one-step-trellis periods and in FIG. 13 for odd one-step-trellis periods of a two-step-trellis cycle.

In FIGS. 12 and 13, the survivor bits of the win-lose path 810, which are selected by ēF, and the survivor bits of the lose-win path 830, which are selected by ef̄, are compared to the survivor bits of the win-win path 820, which are selected by ef, to generate corresponding equivalence bits. The path comparison unit 1200 resembles the register-exchange implementation of the survivor memory unit 1100. The bottom row of the path comparison units 1200-even, 1200-odd contain registers 1220 and multiplexers 1210 that store and select the survivor paths for every state.

In addition, the top and middle rows of the path comparison units 1200-even, 1200-odd contain two multiplexers 1210 per one-step-trellis period and state that select the bits of the competing lose-win path 830 and win-lose path 810 using the selection signals ef̄ and ēF, respectively, and there are two XOR gates that generate respective equivalence bits indicating whether the bit for the respective path (the lose-win path 830 or win-lose path 810 associated with the selection signals ef̄ and ēF) and the bit for the winning (win-win) path are equivalent. The notation $q_{-2,0}$ indicates the equivalence bit for survivor bit $b_{-2}$ and path metric difference $\Delta'_0$, while $q_{-2,-1}$ indicates the equivalence bit for survivor bit $b_{-2}$ and path metric difference $\Delta'_{-1}$. Each column of the path comparison units 1200-even, 1200-odd corresponds to an even and odd one-step-trellis period, respectively.

A structure similar to the one shown in FIGS. 12 and 13 is required for each state. While FIGS. 12 and 13 show a number of columns each containing three multiplexers, two XOR gates and one register, the first column in FIG. 12 only includes two multiplexers, one XOR gate and one register, as it computes only one equivalence bit, i.e. $q_{0,0}$ in the exemplary embodiment. The path comparison unit generates, for each state, equivalence bits up to $q_{-U+2,-1}, q_{-U+2,0}$ and $q_{-U+1,-1}, q_{-U+1,0}$, respectively, where U is the reliability update length. In the exemplary embodiment 1200, U=6.

Reliability Update Unit

Figure 14:
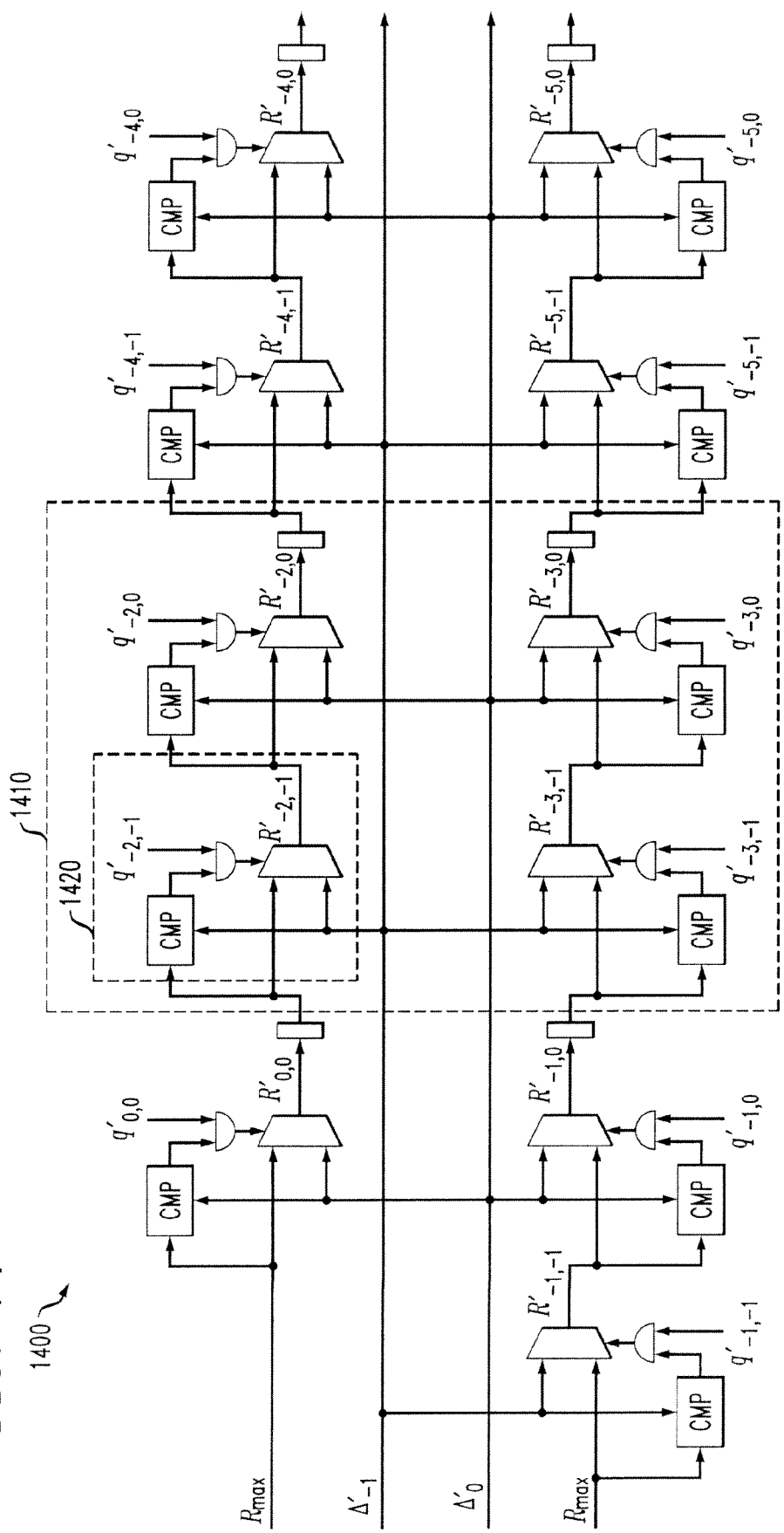
FIG. 14 is a schematic block diagram showing an exemplary implementation of the reliability update of FIG. 7 for the maximum-likelihood (ML) path.

FIG. 14 is a schematic block diagram showing an exemplary implementation of the reliability update unit 1400 of FIG. 7 that updates the reliabilities for the maximum-likelihood path 820. The exemplary reliability update unit 1400 computes and stores two reliability values per two-step-trellis cycle.

$\Delta'_{-1}$ and $\Delta'_0$ are the delayed path metric differences for the ML path 820 into the starting state (see FIG. 7). These two values are selected among the buffered path metric differences using the starting state signal as shown in FIG. 7.

$q'_{0,0}, q'_{-1,-1}, q'_{-1,0}, q'_{-2,-1}, q'_{-2,0}, q'_{-3,-1}, q'_{-3,0}, \ldots$ are the equivalence bits for the ML path into the starting states state $(b'_{-1}b'_{-2}b'_{-3})$ and state$(b'_0 b'_{-1} b'_{-2})$. These signals are selected among the equivalence bits computed in the path comparison unit (see FIGS. 12 and 13) using the starting state signal as shown in FIG. 7.

The reliabilities $R'_{0,0}, R'_{-1,0}, R'_{-2,0}, R'_{-3,0}, R'_{-4,0}, R'_{-5,0}, \ldots$ are updated based on $\Delta'_0$, whereas $R'_{-1,-1}, R'_{-2,-1}, R'_{-3,-1}, R'_{-4,-1}, R'_{-5,-1} \ldots$ are updated based on $\Delta'_{-1}$.

$R_{max}$ is a hard-wired value and denotes the maximum reliability value, e.g., $R_{max}=\infty$. The first reliabilities $R'_{0,0}$ and $R'_{-1,-1}$ consider $R_{max}$ as an initialization value in the exemplary embodiment.

After initialization, a functional element, such as the exemplary functional element 1410, comprises four functional units, such as the exemplary functional unit 1420, and two registers. Each functional unit 1420 comprises a comparator, a multiplexer and an AND gate. The top row of the reliability update unit 1400 computes reliability values for even one-step-trellis periods and the bottom row computes reliability values for odd one-step-trellis periods. For example, $R'_{0,0}$ (computed in the previous two-step-trellis cycle) and $\Delta'_{-1}$ are used to compute $R'_{-2,-1}$, under control of the corresponding equivalence bit $q'_{-2,-1}$. Thereafter $R'_{-2,-1}$ and $\Delta'_0$ are used to compute $R'_{-2,0}$ under control of the corresponding equivalence bit $q'_{-2,0}$. Thus, two functional units operate in series to first compute $R'_{-2,-1}$ and then $R'_{-2,0}$. In an analogous fashion, two functional units operate in series to first compute $R'_{-3,-1}$ and then $R'_{-3,0}$, by using the path metric differences, $\Delta'_{-1}$ and $\Delta'_0$, and corresponding equivalence bits. In summary, two groups of functional units operate in parallel to compute the reliability values $R'_{-2,0}$ and $R'_{-3,0}$ for the same two-step-trellis cycle, where each group comprises two functional units that operate in series.

The reliability unit 1400 computes the final reliabilities $R'_{-U+2}=R'_{-U+2,0}$ and $R'_{-U+1}=R'_{-U+1,0}$, where U is the reliability update length. Soft decisions $S'_i$ are generated based on the final reliability values and corresponding bit decisions, e.g. according to the rule:

$$S'_i = \begin{cases} R'_i & \text{if } b'_i \equiv 0 \\ -R'_i & \text{if } b'_i \equiv 1. \end{cases}$$

It is to be understood that the embodiments and variations shown and described herein are merely illustrative of the principles of this invention and that various modifications may be implemented by those skilled in the art without departing from the scope and spirit of the invention.

We claim:

1. A path metric difference computation unit for computing differences between paths through a multiple-step trellis, wherein a first of said plurality of paths is a winning path for each single-step-trellis period of a multiple-step-trellis cycle, a second of said plurality of paths is a winning path for a first single-step-trellis period and is a losing path for a second single-step-trellis period of the multiple-step-trellis cycle and a third of said plurality of paths is a losing path for the first single-step-trellis period and is a winning path for the second single-step-trellis period of the multiple-step-trellis cycle, comprising:

one or more path metric difference generators for generating a path metric difference $\Delta_0$ for the second single-step-trellis period of the multiple-step-trellis cycle based on a difference between the first path and the second path, and a path metric difference $\Delta_{-1}$ for the first single-step-trellis period of the multiple-step-trellis cycle based on a difference between the first path and the third path, wherein one or more of intermediate path metric values and intermediate path metric difference values are reused to generate one or more of said path metric differences $\Delta_0$ and $\Delta_{-1}$.

2. The path metric difference computation unit of claim 1, further comprising a comparator to compare path metrics of said second path and a fourth path to identify said second path and a subtractor to determine said path metric difference $\Delta_0$ between the first and second paths.

3. The path metric difference computation unit of claim 2, wherein an output of said comparator is a selection signal, F.

4. The path metric difference computation unit of claim 3, wherein said selection signal, F, is used to compute equivalence bits in a path metric comparison unit.

5. The path metric difference computation unit of claim 2, further comprising a selector to select between said path metrics of said second and fourth paths to identify said second path based on a selection signal.

6. The path metric difference computation unit of claim 2, wherein each of said path metrics of said second path and said fourth path are selected from a plurality of newly computed path metrics.

7. The path metric difference computation unit of claim 1, further comprising a subtractor to determine said path metric difference $\Delta_{-1}$ between the first and third paths.

8. The path metric difference computation unit of claim 7, wherein the path metric of said third path is selected from a plurality of newly computed path metrics.

9. The path metric difference computation unit of claim 1, further comprising one or more pipeline registers and wherein said first path is determined in a first multiple-step-trellis cycle and said path metric differences are generated in a subsequent multiple-step-trellis cycle.

10. The path metric difference computation unit of claim 1, further comprising a comparator for determining a path metric for said first path into a state by comparing path metrics for path extensions into said state.

11. The path metric difference computation unit of claim 1, further comprising one or more adders, comparators and selectors to perform an add-compare-select operation for a state to determine said first path.

12. The path metric difference computation unit of claim 11, wherein the newly computed path metrics obtained from said add-compare select operation are reused to generate the one or more of said path metric differences $\Delta_0$ and $\Delta_{-1}$.

13. The path metric difference computation unit of claim 1, further comprising a plurality of comparators for computing path metric differences between a plurality of paths into a given state.

14. The path metric difference computation unit of claim 13, further comprising a selector to determine the first path based on outputs of said plurality of comparators.

15. The path metric difference computation unit of claim 14, wherein the path metric differences used to determine the first path are reused to generate the one or more of said path metric differences $\Delta_0$ and $\Delta_{-1}$.

16. The path metric difference computation unit of claim 1, further comprising a selector to select said path metric difference $\Delta_{-1}$ based on one or more selection signals.

17. The path metric difference computation unit of claim 1, further comprising a comparator that compares the path metric difference between said first path and said second path and the path metric difference between said first path and a path that is a losing path for said first and second single-step-trellis periods of a multiple-step-trellis cycle to generate a selection signal F.

18. The path metric difference computation unit of claim 17, wherein said selection signal, F, is used to compute equivalence bits in a path metric comparison unit.

19. The path metric difference computation unit of claim 1, further comprising a selector to select said path metric difference $\Delta_0$ based on one or more selection signals.

20. The path metric difference computation unit of claim 1, wherein said path metric differences $\Delta_0$ and $\Delta_{-1}$ are used to compute reliabilities in a reliability unit.

* * * * *